United States Patent
Song

(10) Patent No.: US 10,840,309 B2
(45) Date of Patent: Nov. 17, 2020

(54) METHOD OF FABRICATING COLOR FILTER

(71) Applicant: SHENZHEN CHINA STAR OPTOELECTRONICS TECHNOLOGY CO,. LTD., Guangdong (CN)

(72) Inventor: Jiangjiang Song, Guangdong (CN)

(73) Assignee: SHENZHEN CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 41 days.

(21) Appl. No.: 16/467,053

(22) PCT Filed: Mar. 22, 2019

(86) PCT No.: PCT/CN2019/079323
§ 371 (c)(1),
(2) Date: Jun. 6, 2019

(87) PCT Pub. No.: WO2020/172934
PCT Pub. Date: Sep. 3, 2020

(65) Prior Publication Data
US 2020/0273914 A1    Aug. 27, 2020

(30) Foreign Application Priority Data
Feb. 27, 2019 (CN) .......................... 2019 1 0143984

(51) Int. Cl.
*H01L 51/56* (2006.01)
*H01L 27/32* (2006.01)
*H01L 51/52* (2006.01)

(52) U.S. Cl.
CPC ........ *H01L 27/322* (2013.01); *H01L 51/5284* (2013.01); *H01L 51/56* (2013.01); *H01L 2251/105* (2013.01)

(58) Field of Classification Search
None
See application file for complete search history.

(56) References Cited

U.S. PATENT DOCUMENTS 6,238,583 B1 * 5/2001 Edlinger ................ G02B 5/201
216/24
9,761,632 B2 * 9/2017 Li ......................... H01L 27/156

* cited by examiner

*Primary Examiner* — Bradley Smith
(74) *Attorney, Agent, or Firm* — Mark M. Friedman

(57) ABSTRACT

A method of fabricating a color filter is provided. In the method of fabricating the color filter, a patterned sacrificial layer having a thickness difference is formed on a substrate such that a patterned black photosensitive spacing material layer is formed by a single-tone photomask or a half-tone photomask and has effects of an original black matrix, a main spacer, and a sub-spacer. Thus, production costs can be reduced and a high yield can be carried out.

20 Claims, 8 Drawing Sheets

METHOD OF FABRICATING COLOR FILTER

FIELD OF DISCLOSURE

The present disclosure relates to a method of fabricating display components, and more particularly to a method of fabricating a color filter.

BACKGROUND OF DISCLOSURE

Compared with liquid crystal displays (LCDs), organic light emitting diode devices have advantages such as being self light emitting, having fast response times, wide viewing angles, high brightness, bright colored, thin profile, and so on, and the organic light emitting diode devices are considered as the next generation of display technology.

Referring to FIG. 7, FIG. 7 is a cross-sectional schematic diagram of a conventional color filter 70. For a color filter 70 used in the organic light emitting diode displays, generally, a black matrix 72 is generally formed between a plurality of pixels 71 (or a plurality of sub-pixels 711). Thereafter, a transparent conductive layer 73 is formed on the pixels 71 (or the plurality of sub-pixels 711) and the black matrix 72, and a main spacer 74 and a sub-spacer 75 having a different height (or thickness) are formed on the transparent conductive layer 73.

In order to reduce the above-described process of forming the black matrix 72, the main spacer 74, and the sub-spacer 75, a black photosensitive spacing material layer can be formed on the transparent conductive layer by a single mask. However, since it is necessary to separately form three different height (or thickness) black photosensitive spacing material layers on the light-transmitting conductive layer to be used as effects of an original black matrix, the main spacer, and the sub-spacer, it is necessary to use three-tone mask to complete a patterned black photosensitive spacing material layer. However, the three-tone mask is not only costly, but also results in low yield of the formed black photosensitive spacing material layer.

Therefore, it is necessary to provide a method of fabricating a color filter to solve problems existing in the conventional technologies.

SUMMARY OF DISCLOSURE

In view of the above, the present disclosure provides a method of fabricating a color filter to solve problems of a high cost and a low yield of forming a black photosensitive spacing material layer using a three-tone mask in the prior art.

An object of the present disclosure is to provide a method of fabricating a color filter, such that a patterned black photosensitive spacing material layer is formed by a single-tone photomask or a half-tone photomask and has effects of an original black matrix, a main spacer, and a sub-spacer.

To achieve the above object, an embodiment of the present disclosure provides a method of fabricating a color filter comprising steps of: providing a substrate; forming a patterned sacrificial layer on the substrate, wherein the patterned sacrificial layer comprises a first sacrificial pattern region and a second sacrificial pattern region, wherein the first sacrificial pattern region is adjacent to the second sacrificial pattern region, and a thickness of the first sacrificial pattern region is greater than a thickness of the second sacrificial pattern region, wherein a thickness difference between the first sacrificial pattern region and the second sacrificial pattern region is between 0.8 and 1.5 micrometers, and a width of the first sacrificial pattern region is between 10 and 25 micrometers; forming a pixel layer on the patterned sacrificial layer, the pixel layer comprising a plurality of pixels, wherein a pixel boundary is defined between each two of the pixels adjacent to each other, and the pixel boundary is disposed on the first sacrificial pattern region, wherein each of the plurality of pixels comprises a plurality of sub-pixels, wherein a sub-pixel boundary is defined between each two of the sub-pixels adjacent to each other; forming a transparent conductive layer on the pixel layer; and forming a patterned black photosensitive spacing material layer on the transparent conductive layer, wherein the patterned black photosensitive spacing material layer is formed by a single-tone photomask or a half-tone photomask.

In an embodiment of the present disclosure, a portion of each of the sub-pixels adjacent to the sub-pixel boundary has a protrusion.

In an embodiment of the present disclosure, a height of the protrusion is between 0.3 and 0.8 micrometers, and a width of the protrusion is between 10 and 30 micrometers.

In an embodiment of the present disclosure, the second sacrificial pattern region further includes a plurality of grooves, wherein a portion of each of the sub-pixels adjacent to the sub-pixel boundary is formed in the grooves.

In an embodiment of the present disclosure, the plurality of grooves pass through the patterned sacrificial layer.

In an embodiment of the present disclosure, the patterned black photosensitive spacing material layer includes a first black pattern region, a second black pattern region, and a third black pattern region, wherein a position of the first black pattern region aligns to a position of the first sacrificial pattern region, a position of the second black pattern region aligns to a position at the sub-pixel boundary, and a position of the third black pattern region aligns to a position of the plurality of sub-pixels away from the sub-pixel boundary.

In an embodiment of the present disclosure, a height difference is between the first black pattern region and the second black pattern region, wherein the height difference is between 0.3 and 0.8 micrometers.

To achieve the above object, an embodiment of the present disclosure provides a method of fabricating a color filter comprising steps of: providing a substrate; forming a patterned sacrificial layer on the substrate, wherein the patterned sacrificial layer comprises a first sacrificial pattern region and a second sacrificial pattern region, wherein the first sacrificial pattern region is adjacent to the second sacrificial pattern region, and a thickness of the first sacrificial pattern region is greater than a thickness of the second sacrificial pattern region; forming a pixel layer on the patterned sacrificial layer, the pixel layer comprising a plurality of pixels, wherein a pixel boundary is defined between each two of the pixels adjacent to each other, and the pixel boundary is disposed on the first sacrificial pattern region; forming a transparent conductive layer on the pixel layer; and forming a patterned black photosensitive spacing material layer on the transparent conductive layer, wherein the patterned black photosensitive spacing material layer is formed by a single-tone photomask or a half-tone photomask.

In an embodiment of the present disclosure, a thickness difference between the first sacrificial pattern region and the second sacrificial pattern region is between 0.8 and 1.5 micrometers, and a width of the first sacrificial pattern region is between 10 and 25 micrometers.

In an embodiment of the present disclosure, each of the plurality of pixels comprises a plurality of sub-pixels, wherein a sub-pixel boundary is defined between each two of the sub-pixels adjacent to each other.

In an embodiment of the present disclosure, a portion of each of the sub-pixels adjacent to the sub-pixel boundary has a protrusion.

In an embodiment of the present disclosure, a height of the protrusion is between 0.3 and 0.8 micrometers, and a width of the protrusion is between 10 and 30 micrometers.

In an embodiment of the present disclosure, the second sacrificial pattern region further includes a plurality of grooves, wherein a portion of each of the sub-pixels adjacent to the sub-pixel boundary is formed in the grooves.

In an embodiment of the present disclosure, the plurality of grooves pass through the patterned sacrificial layer.

In an embodiment of the present disclosure, the patterned black photosensitive spacing material layer includes a first black pattern region, a second black pattern region, and a third black pattern region, wherein a position of the first black pattern region aligns to a position of the first sacrificial pattern region, a position of the second black pattern region aligns to a position at the sub-pixel boundary, and a position of the third black pattern region aligns to a position of the plurality of sub-pixels away from the sub-pixel boundary.

In an embodiment of the present disclosure, a height difference is between the first black pattern region and the second black pattern region, wherein the height difference is between 0.3 and 0.8 micrometers.

Furthermore, another embodiment of the present disclosure is to provide another method of fabricating a color filter comprising steps of: providing a substrate; forming a patterned sacrificial layer on the substrate, wherein the patterned sacrificial layer comprises a first sacrificial pattern region and a second sacrificial pattern region, wherein the first sacrificial pattern region is adjacent to the second sacrificial pattern region, and a thickness of the first sacrificial pattern region is greater than a thickness of the second sacrificial pattern region, wherein the patterned sacrificial layer is formed by a single-tone photomask or a half-tone photomask; forming a pixel layer on the patterned sacrificial layer, the pixel layer comprising a plurality of pixels, wherein a pixel boundary is defined between each two of the pixels adjacent to each other, and the pixel boundary is disposed on the first sacrificial pattern region; forming a transparent conductive layer on the pixel layer; and forming a patterned black photosensitive spacing material layer on the transparent conductive layer, wherein the patterned black photosensitive spacing material layer is formed by the single-tone photomask or the half-tone photomask.

In an embodiment of the present disclosure, a thickness difference between the first sacrificial pattern region and the second sacrificial pattern region is between 0.8 and 1.5 micrometers, and a width of the first sacrificial pattern region is between 10 and 25 micrometers.

In an embodiment of the present disclosure, each of the plurality of pixels comprises a plurality of sub-pixels, wherein a sub-pixel boundary is defined between each two of the sub-pixels adjacent to each other.

In an embodiment of the present disclosure, a portion of each of the sub-pixels adjacent to the sub-pixel boundary has a protrusion.

Compared with the conventional technologies, In the method of fabricating the color filter of the present disclosure, the patterned sacrificial layer having a thickness difference is formed on the substrate such that the patterned black photosensitive spacing material layer is formed by the single-tone photomask or the half-tone photomask and has effects of an original black matrix, a main spacer, and a sub-spacer. Thus, production costs can be reduced and a high yield can be carried out.

To make the above description of the present disclosure more clearly comprehensible, it is described in detail below in examples of preferred embodiments with the accompanying drawings.

DETAILED DESCRIPTION OF PREFERRED EMBODIMENTS

Following description of the various embodiments is provided to illustrate the specific embodiments of the present disclosure. Furthermore, directional terms mentioned in the present disclosure, such as upper, lower, top, bottom, front, rear, left, right, inner, outer, side, surrounding, central, horizontal, horizontal, vertical, longitudinal, axial, radial, an uppermost layer or a lowermost layer, etc., only refer to a direction of the accompanying figures. Therefore, the used directional terms are used to describe and understand the present disclosure, but the present disclosure is not limited thereto.

Figure 1:
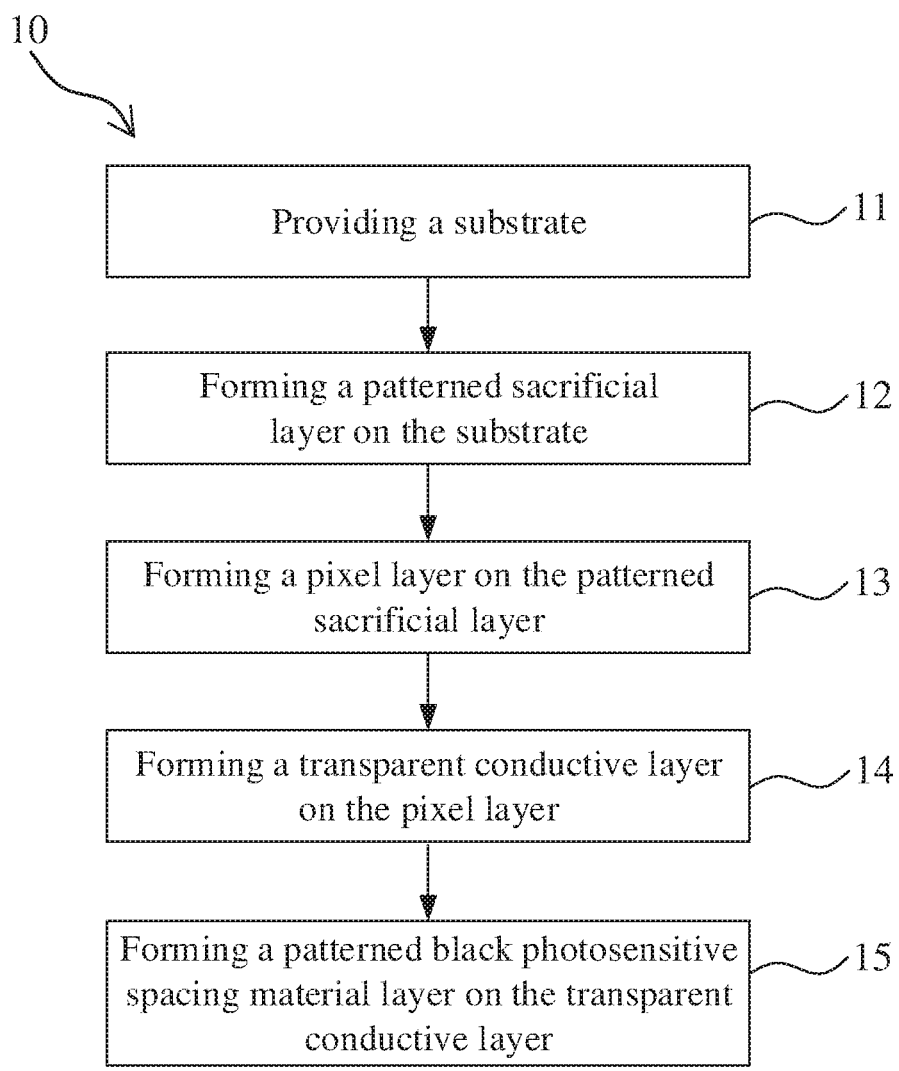
FIG. 1 is a flowchart of a color filter according to an embodiment of the present disclosure.

Referring to FIG. 1, a method 10 of fabricating a color filter in an embodiment of the present disclosure comprises steps 11 to 15 of providing a substrate (step 11); forming a patterned sacrificial layer on the substrate, wherein the patterned sacrificial layer comprises a first sacrificial pattern region and a second sacrificial pattern region, wherein the first sacrificial pattern region is adjacent to the second sacrificial pattern region, and a thickness of the first sacrificial pattern region is greater than a thickness of the second sacrificial pattern region (step 12); forming a pixel layer on the patterned sacrificial layer, the pixel layer comprising a plurality of pixels, wherein a pixel boundary is defined between each two of the pixels adjacent to each other, and the pixel boundary is disposed on the first sacrificial pattern region (step 13); forming a transparent conductive layer on the pixel layer (step 14); and forming a patterned black photosensitive spacing material layer on the transparent conductive layer, wherein the patterned black photosensitive spacing material layer is formed by a single-tone photomask or a half-tone photomask (step 15). Details of the implementation and principles of the above-described steps of embodiments will be described in detail below.

Figure 2A:
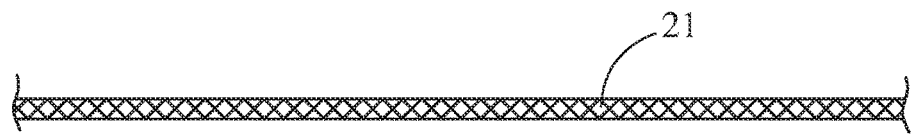
FIGS. 2A to 2F are cross-sectional schematic diagrams of a fabricating method of a display panel in each of processes according to an embodiment of the present disclosure.

At first, referring to FIGS. 1 and 2A, the method 10 of fabricating the color filter according to an embodiment of the present disclosure includes step 11 of providing a substrate 21. In the step 11, the substrate 21 is such as a base substrate, which can be used to support various components of a display panel. In an embodiment, the substrate 21 is such as a flexible substrate, a transparent substrate, or a flexible and transparent substrate.

Figure 2B:
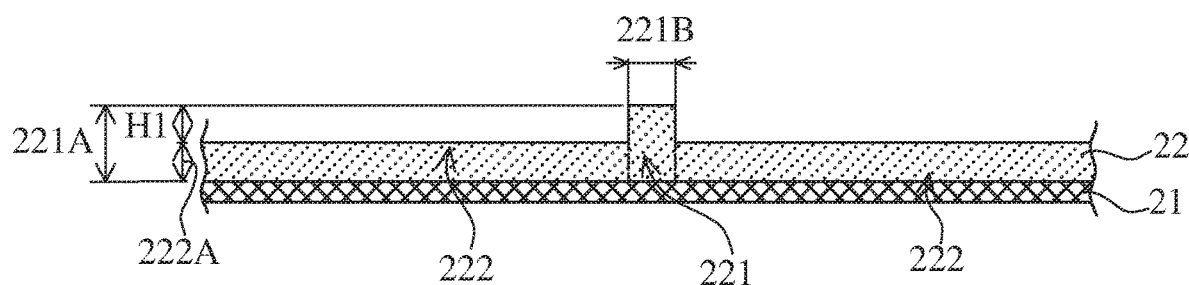

Then, referring to FIGS. 1 and 2B, the method 10 of fabricating the color filter according to an embodiment of the present disclosure includes step 12 of: forming a patterned sacrificial layer 22 on the substrate 21, wherein the patterned sacrificial layer 22 comprises a first sacrificial pattern region 221 and a second sacrificial pattern region 222, wherein the first sacrificial pattern region 221 is adjacent to the second sacrificial pattern region 222, and a thickness 221A of the first sacrificial pattern region 221 is greater than a thickness 222A of the second sacrificial pattern region 222. In the step 12, formation locations of the first sacrificial pattern region 221 and the second sacrificial pattern region 222 have a corresponding relationship with a location of a subsequently formed patterned black photosensitive spacing material layer, which will be described in detail later. In one embodiment, the patterned sacrificial layer 22 can be formed by, for example, firstly forming a complete sacrificial material on the substrate 21 by deposition, and then performing photolithography etching on the sacrificial material to form the patterned sacrificial layer 22. In another embodiment, a thickness difference H1 between the first sacrificial pattern region 221 and the second sacrificial pattern region 222 is between 0.8 and 1.5 micrometers, and a width 221B of the first sacrificial pattern region 221 is between 10 and 25 microns. In an embodiment, the step of forming the patterned sacrificial layer can be formed by a single-tone photomask or a half-tone photomask.

Figure 2C:
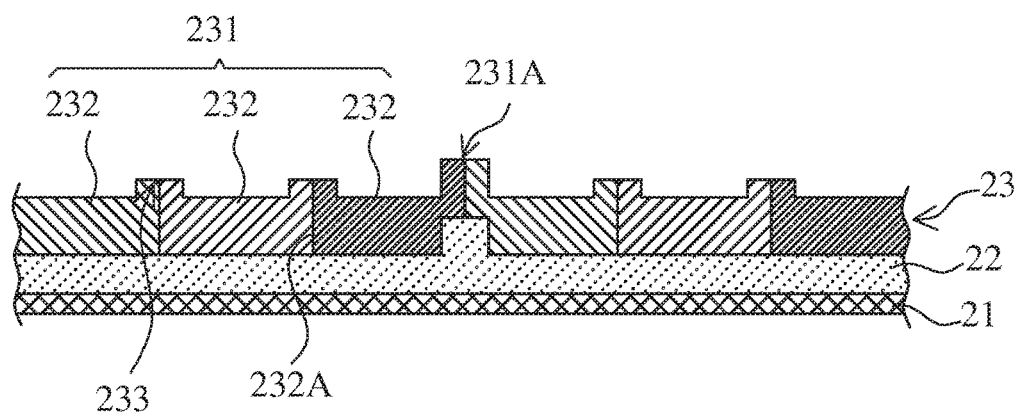

Then, referring to FIGS. 1 and 2C, the method 10 of fabricating the color filter according to an embodiment of the present disclosure includes step 13 of forming a pixel layer 23 on the patterned sacrificial layer 22, the pixel layer comprising a plurality of pixels 231, wherein a pixel boundary 231A is defined between each two of the pixels 231 adjacent to each other, and the pixel boundary 231A is disposed on the first sacrificial pattern region 221. In the step 23, each of the plurality of pixels 231 can include a plurality of sub-pixels 232, wherein a sub-pixel boundary 232A is defined between each two of the sub-pixels adjacent to each other. In an example, each of the pixels 231 can have three sub-pixels 232 (for example, a red sub-pixel, a green sub-pixel, and a blue sub-pixel, respectively). In an embodiment, a portion of each of the sub-pixels 232 adjacent to the sub-pixel boundary 232A has a protrusion 233. In an example, a height of the protrusion 233 is between 0.3 and 0.8 micrometers, and a width of the protrusion 233 is between 10 and 30 micrometers. An effect of the protrusion 233 will be described in subsequent paragraphs. It is noted that a method and material of fabricating the pixel layer used in a general color filter can be used in a method and material of fabricating the pixel layer 23.

Figure 2D:
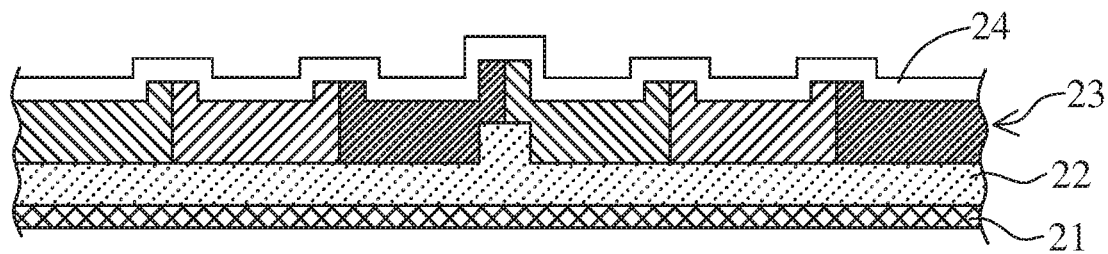

Then, referring to FIGS. 1 and 2D, the method 10 of fabricating the color filter according to an embodiment of the present disclosure includes step 14 of forming a transparent conductive layer 24 on the pixel layer 23. In the step 14, the transparent conductive layer 24 is formed on the pixel layer 23 by, for example, deposition or sputtering. It is noted that a method and material of fabricating the transparent conductive layer used in a general color filter can be used in a method and material of fabricating the transparent conductive layer 24.

Figure 2E:
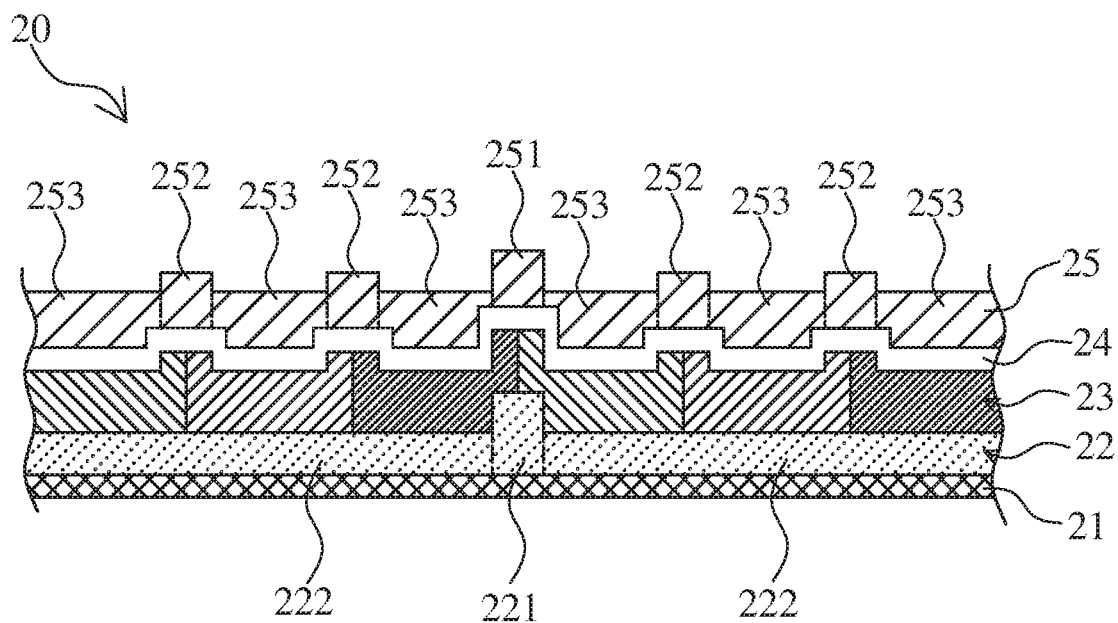

Then, referring to FIGS. 1 and 2E, the method 20 of fabricating the color filter according to an embodiment of the present disclosure includes step 15 of forming a patterned black photosensitive spacing material layer 25 on the transparent conductive layer 24, wherein the patterned black photosensitive spacing material layer 25 is formed by a single-tone photomask or a half-tone photomask. In the step 15, the patterned black photosensitive spacing material layer 25 includes a first black pattern region 251, a second black pattern region 252, and a third black pattern region 253, wherein a position of the first black pattern region 251 aligns to a position of the first sacrificial pattern region 221, a position of the second black pattern region 252 aligns to a position at the sub-pixel boundary 232A (as shown in FIG. 2C), and a position of the third black pattern region 253 aligns to a position of the plurality of sub-pixels 232 away from the sub-pixel boundary 232A (as shown in FIG. 2C). It is noted that the method 10 of fabricating the color filter according to an embodiment of the present disclosure is mainly formed without using a three-tone photomask, so that the patterned black photosensitive spacing material layer 25 can have effects of an black matrix, a main spacer, and a sub-spacer.

For forming the patterned black photosensitive spacing material layer 25 using a single-tone photomask, only two thickness of the patterned black photosensitive spacing material layer 25 can be formed using a single-tone photomask (for example, a light transmissive position of the single-tone photomask is used to retain a thickness of the patterned black photosensitive spacing material layer 25, and a non-light transmissive position of the single-tone photomask is used to remove the thickness of the patterned black photosensitive spacing material layer 25). In a case of using a single-tone photomask, under an embodiment having the protrusion 233, the patterned black photosensitive spacing material layer 25 can have effects of a black matrix, a main spacer, and a sub-spacer. Specifically, since the thickness 221A of the first sacrificial pattern region 221 is greater than the thickness 222A of the second sacrificial pattern region 222, the first sacrificial pattern region 221 raises a height of the patterned black photosensitive spacing material layer 25, such that the patterned black photosensitive spacing material layer 25 (i.e., the first black pattern region 251) positioned above the first sacrificial pattern region 221 can be used as the main spacer. On the other hand, since the protrusion 233 is adjacent to the sub-pixel boundary 232A (as shown in FIG. 2C), when the patterned black photosensitive spacing material layer 25 is formed at the sub-pixel boundary 232A (as shown in FIG. 2C), the protrusion 233 raises the height of the patterned black photosensitive spacing material layer 25, thereby causing the patterned black photosensitive spacing material layer 25 located on the protrusion 233 (i.e., the second black pattern region 252) can be used as the sub-spacer. In another aspect, the third black pattern region 253 is not affected by the height of the protrusion 233 or the first sacrificial pattern region 221, so the third black pattern region 253 is lower than the first black pattern region 251 and the second black pattern area 252 can directly function as the black matrix. It can be seen from the above that by providing the protrusion 233 and the first sacrificial pattern region 221, under a premise of using only a single-tone photomask (a single-tone photomask of a single photomask process), the patterned black photosensitive spacing material layer 25 can have the effects of the black matrix, the main spacer, and the sub-spacer.

Figure 3:
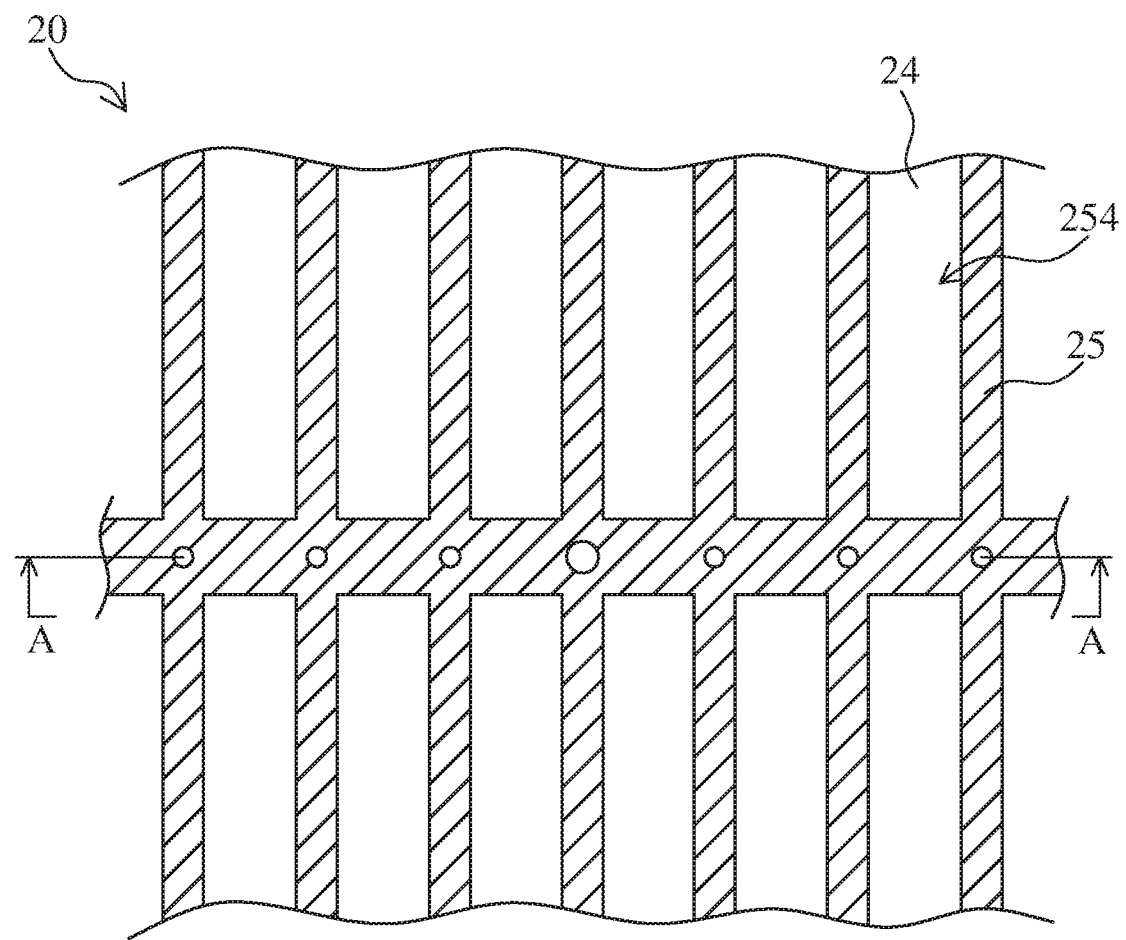
FIG. 3 is a top view of a color filter according to an embodiment of the disclosure.

Referring to FIG. 3, FIG. 3 is a top view of a color filter 20 according to an embodiment of the disclosure, wherein a section A-A can correspond to the cross-sectional schematic diagram of FIG. 2E. It is noted that the non-transmissive region of the single-tone photomask (or the half-tone photomask described later) is mainly aligned to an opening region 254 to expose the light-transmitting conductive layer 24. Since the light-transmitting conductive layer 24 has a light-transmitting property, the pixel layer 23 located under the light-transmitting conductive layer can be prevented from being blocked to have a filtering effect.

Figure 4A:
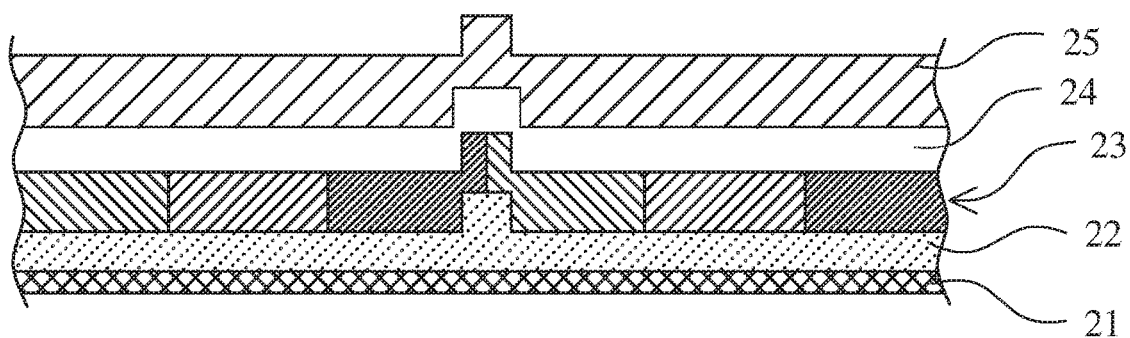
FIGS. 4A and 4B are cross-sectional schematic diagrams of a color filter before and after forming a patterned black photosensitive spacing material layer according to another embodiment of the present disclosure, respectively.
Figure 4B:
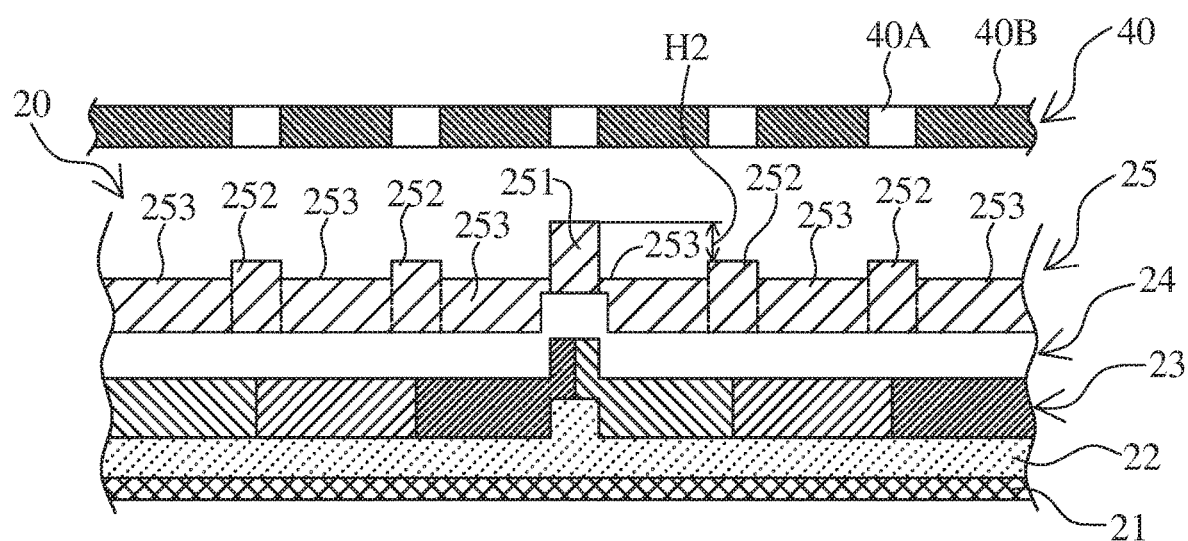

Referring to FIGS. 4A and 4B, for forming the patterned black photosensitive spacing material layer 25 using a half-tone photomask 40, three thickness of the patterned black photosensitive spacing material layer 25 can be formed using a single-tone photomask (For example, a full light-transmissive position 40A of the half-tone photomask is used to retain an entire thickness of the patterned black photosensitive spacing material layer 25, and a semi-transmissive position 40B of the half-tone photomask is used to retain a thickness of a portion of the patterned black photosensitive spacing material layer 25. A non-transmissive position of the half-tone photomask 40 (not shown, the non-transmissive position aligning to an open region 254 (shown in FIG. 3) is used to remove all thickness of the patterned black photosensitive spacing material layer 25.). In a case of using a half-tone photomask, under an embodiment without the protrusion 233, the patterned black photosensitive spacing material layer 25 can have effects of the black matrix, the main spacer, and the sub-spacer. Specifically, since the thickness 221A (as shown in FIG. 2B) of the first sacrificial pattern region 221 is greater than the thickness 222A of the second sacrificial pattern region 222, the first sacrificial pattern region 221 raises a height of the patterned black photosensitive spacing material layer 25, such that the patterned black photosensitive spacing material layer 25 (i.e., the first black pattern region 251) positioned above the first sacrificial pattern region 221 can be used as the main spacer, wherein the position of the first black pattern region 251 aligns to the full light-transmissive position 40A of the half-tone photomask 40. Although the protrusion 233 is not present at the sub-pixel boundary 232A, since the first sacrificial pattern region 221 is raised by the first black pattern region 251, even the first black pattern region 251 and the second black pattern regions 252 all align to the full light-transmissive position 40A of the halftone photomask 40, a height of the first black pattern region 251 is still higher than a height of the second black pattern region 252, so that the second black pattern region 252 can be used as the sub-spacer. In an embodiment, a height difference H2 is between the first black pattern region 251 and the second black pattern region 252, wherein the height difference H2 is between 0.3 and 0.8 micrometers. In yet another aspect, a position of the third black pattern region 253 aligns to a position of the plurality of sub-pixels 232 away from the sub-pixel boundary 232A (as shown in FIG. 2C), wherein the third black pattern region 253 aligns to the semi-transmissive position 40B of the half-tone photomask 40. This is because the third black pattern region 253 is used as the black matrix, it needs to be lower than the height of the second black pattern region 252. Therefore, it is necessary to reduce the thickness of the third black pattern region 253 by the semi-transmissive position of the half-tone photomask.

Figure 5A:
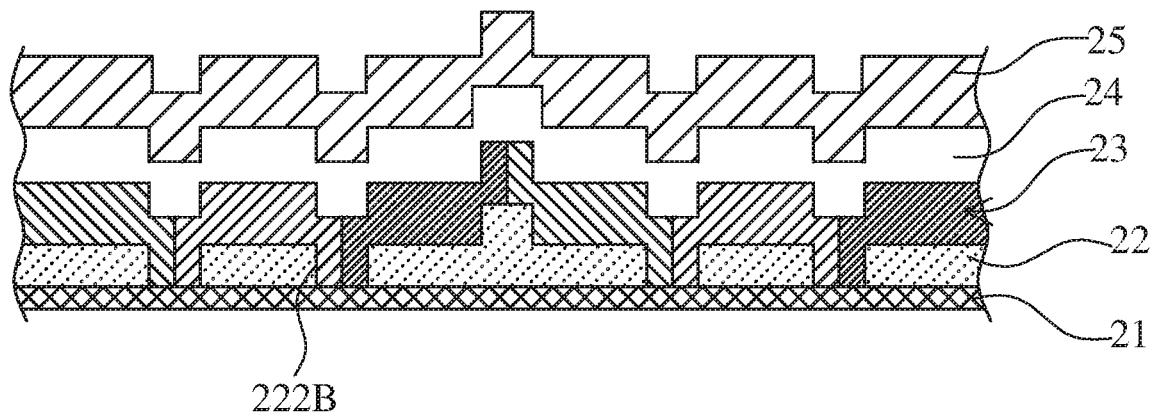
FIGS. 5A and 5B are cross-sectional schematic diagrams of a color filter before and after forming the patterned black photosensitive spacing material layer according to a further embodiment of the present disclosure, respectively.
Figure 5B:
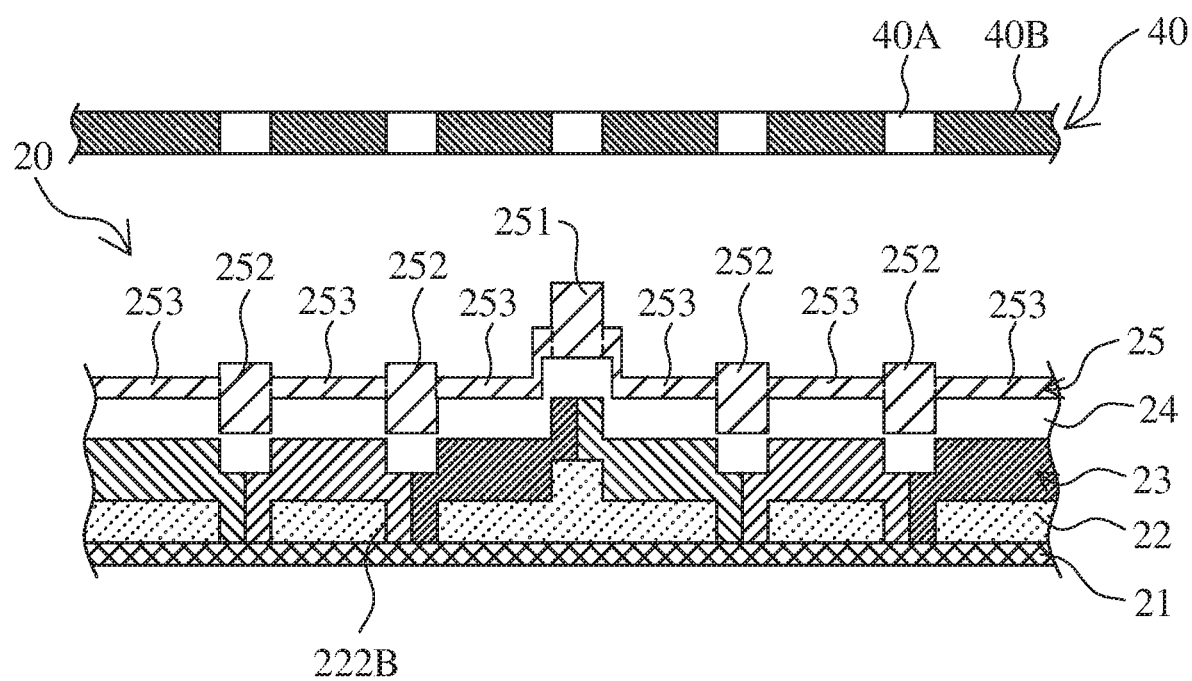
Figure 6A:
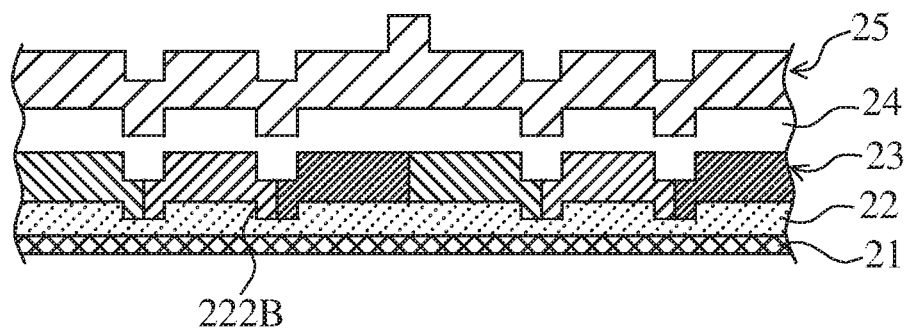
FIGS. 6A and 6B are cross-sectional schematic diagrams of a color filter before and after forming the patterned black photosensitive spacing material layer according to a still another of the present disclosure, respectively.
Figure 6B:
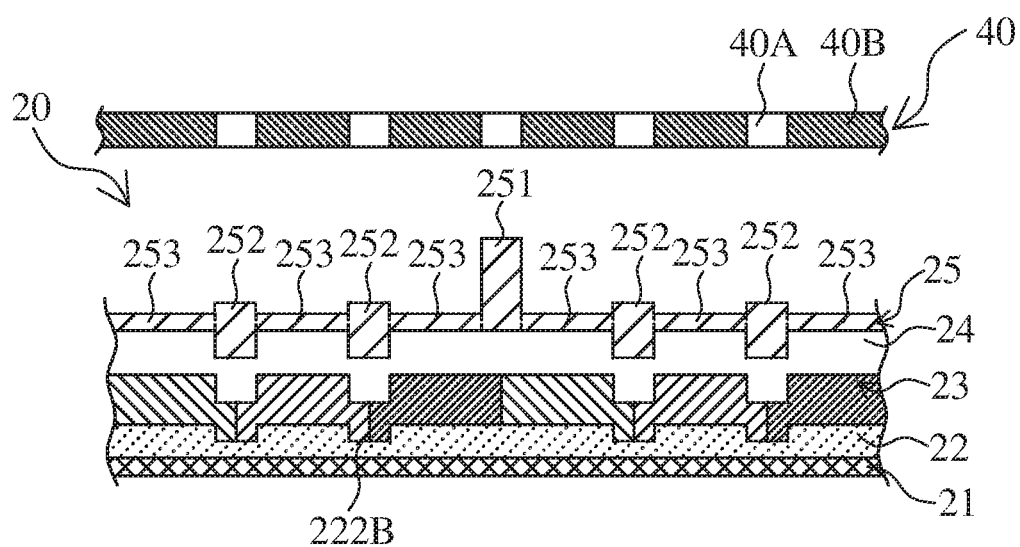
Figure 7:
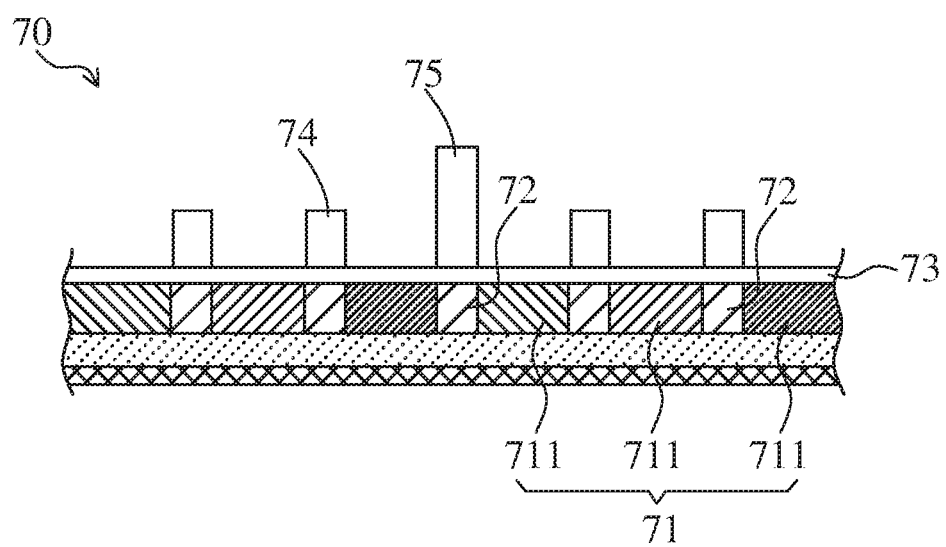
FIG. 7 is a cross-sectional schematic diagram of a conventional color filter.

In an embodiment, referring to FIGS. 5A to 6B, the step 12 of forming the patterned sacrificial layer can be formed by a single-tone photomask or a half-tone photomask. When the patterned sacrificial layer 22 is formed using the half-tone photomask, the second sacrificial pattern region 222 can further include a plurality of grooves 222B (as shown in FIGS. 6A and 6B), wherein a portion of each of the sub-pixels 232 adjacent to the sub-pixel boundary 232A is formed in the grooves 222B. In an embodiment, the plurality of grooves 222B pass through the patterned sacrificial layer 22 (as shown in FIGS. 5A and 5B). In the embodiment, the plurality of grooves 222B have an effect of lowering the second black pattern region 252. Therefore, when the patterned black photosensitive spacing material layer 25 is formed by using the half-tone photomask, the first black pattern region 251 and the second black pattern region 252 both align to the full light-transmissive position 40A of the half-tone photomask 40, and the third black pattern region 253 aligns the semi-transmissive position 40B of the half-tone photomask 40, such that the height of the third black pattern region 253 is lower than the second black pattern region 252.

In an embodiment, referring to FIGS. 6A and 6B, the first black pattern region 251 and the third black pattern region 253 of the black photosensitive spacing material layer align to the position of the first sacrificial pattern region 221, and a position of the second black pattern region 252 aligns to the position of the sub-pixel boundary 232A (i.e., the position of the second sacrificial pattern region 221). In the present embodiment, when the patterned black photosensitive spacing material layer 25 is formed by using a half-tone photomask, the first black pattern region 251 and the second black pattern region 252 both correspond to the full light-transmissive position 40A of the half-tone photomask 40, and the third black pattern region 253 aligns to the semi light-transmissive position 40B of the half-tone photomask 40, such that the height of the third black pattern region 253 is lower than the second black pattern region 252.

Figure 2F:
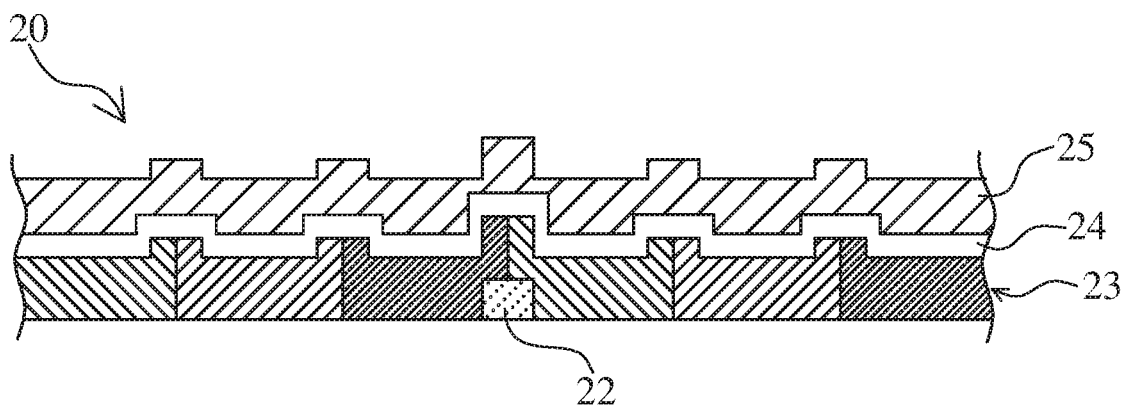

In an embodiment, referring to FIG. 2F, after forming the black photosensitive spacing layer, the substrate 21 and the patterned sacrificial layer 22 can be removed. In an example, a portion or all of the patterned sacrificial layer 22 can be removed.

It can be seen from the above that the formed black photosensitive spacing material layer 25 has the effects of the black matrix, the main spacer, and the sub-spacer, whether using a single-tone photomask or a half-tone photomask process. Therefore, the problems of a high cost and a low yield of forming a black photosensitive spacing material layer using a three-tone mask can be avoided.

The present disclosure has been described in relative embodiments described above, but the above embodiments are merely examples for implementing the present disclosure. It is noted that the disclosed embodiments do not limit the scope of the disclosure. On the contrary, modifications and equal settings included in the spirit and scope of the claims are all included in the scope of the present disclosure.

The invention claimed is:

1. A method of fabricating a color filter, comprising steps of:
    providing a substrate;
    forming a patterned sacrificial layer on the substrate, wherein the patterned sacrificial layer comprises a first sacrificial pattern region and a second sacrificial pattern region, wherein the first sacrificial pattern region is adjacent to the second sacrificial pattern region, and a thickness of the first sacrificial pattern region is greater than a thickness of the second sacrificial pattern region, wherein a thickness difference between the first sacrificial pattern region and the second sacrificial pattern region is between 0.8 and 1.5 micrometers, and a width of the first sacrificial pattern region is between 10 and 25 micrometers;

forming a pixel layer on the patterned sacrificial layer, the pixel layer comprising a plurality of pixels, wherein a pixel boundary is defined between each two of the pixels adjacent to each other, and the pixel boundary is disposed on the first sacrificial pattern region, wherein each of the plurality of pixels comprises a plurality of sub-pixels, wherein a sub-pixel boundary is defined between each two of the sub-pixels adjacent to each other;

forming a transparent conductive layer on the pixel layer; and forming a patterned black photosensitive spacing material layer on the transparent conductive layer, wherein the patterned black photosensitive spacing material layer is formed by a single-tone photomask or a half-tone photomask.

2. The method of fabricating the color filter according to claim 1, wherein a portion of each of the sub-pixels adjacent to the sub-pixel boundary has a protrusion.

3. The method of fabricating the color filter according to claim 2, wherein a height of the protrusion is between 0.3 and 0.8 micrometers, and a width of the protrusion is between 10 and 30 micrometers.

4. The method of fabricating the color filter according to claim 1, wherein the second sacrificial pattern region further includes a plurality of grooves, wherein a portion of each of the sub-pixels adjacent to the sub-pixel boundary is formed in the grooves.

5. The method of fabricating the color filter according to claim 4, wherein the plurality of grooves pass through the patterned sacrificial layer.

6. The method of fabricating the color filter according to claim 1, wherein the patterned black photosensitive spacing material layer includes a first black pattern region, a second black pattern region, and a third black pattern region, wherein a position of the first black pattern region aligns to a position of the first sacrificial pattern region, a position of the second black pattern region aligns to a position at the sub-pixel boundary, and a position of the third black pattern region aligns to a position of the plurality of sub-pixels away from the sub-pixel boundary.

7. The method of fabricating the color filter according to claim 6, wherein a height difference is between the first black pattern region and the second black pattern region, wherein the height difference is between 0.3 and 0.8 micrometers.

8. A method of fabricating a color filter, comprising steps of:

providing a substrate;

forming a patterned sacrificial layer on the substrate, wherein the patterned sacrificial layer comprises a first sacrificial pattern region and a second sacrificial pattern region, wherein the first sacrificial pattern region is adjacent to the second sacrificial pattern region, and a thickness of the first sacrificial pattern region is greater than a thickness of the second sacrificial pattern region;

forming a pixel layer on the patterned sacrificial layer, the pixel layer comprising a plurality of pixels, wherein a pixel boundary is defined between each two of the pixels adjacent to each other, and the pixel boundary is disposed on the first sacrificial pattern region;

forming a transparent conductive layer on the pixel layer; and forming a patterned black photosensitive spacing material layer on the transparent conductive layer, wherein the patterned black photosensitive spacing material layer is formed by a single-tone photomask or a half-tone photomask.

9. The method of fabricating the color filter according to claim 8, wherein a thickness difference between the first sacrificial pattern region and the second sacrificial pattern region is between 0.8 and 1.5 micrometers, and a width of the first sacrificial pattern region is between 10 and 25 micrometers.

10. The method of fabricating the color filter according to claim 8, wherein each of the plurality of pixels comprises a plurality of sub-pixels, wherein a sub-pixel boundary is defined between each two of the sub-pixels adjacent to each other.

11. The method of fabricating the color filter according to claim 10, wherein a portion of each of the sub-pixels adjacent to the sub-pixel boundary has a protrusion.

12. The method of fabricating the color filter according to claim 11, wherein a height of the protrusion is between 0.3 and 0.8 micrometers, and a width of the protrusion is between 10 and 30 micrometers.

13. The method of fabricating the color filter according to claim 10, wherein the second sacrificial pattern region further includes a plurality of grooves, wherein a portion of each of the sub-pixels adjacent to the sub-pixel boundary is formed in the grooves.

14. The method of fabricating the color filter according to claim 13, wherein the plurality of grooves pass through the patterned sacrificial layer.

15. The method of fabricating the color filter according to claim 10, wherein the patterned black photosensitive spacing material layer includes a first black pattern region, a second black pattern region, and a third black pattern region, wherein a position of the first black pattern region aligns to a position of the first sacrificial pattern region, a position of the second black pattern region aligns to a position at the sub-pixel boundary, and a position of the third black pattern region aligns to a position of the plurality of sub-pixels away from the sub-pixel boundary.

16. The method of fabricating the color filter according to claim 15, wherein a height difference is between the first black pattern region and the second black pattern region, wherein the height difference is between 0.3 and 0.8 micrometers.

17. A method of fabricating a color filter, comprising steps of:

providing a substrate;

forming a patterned sacrificial layer on the substrate, wherein the patterned sacrificial layer comprises a first sacrificial pattern region and a second sacrificial pattern region, wherein the first sacrificial pattern region is adjacent to the second sacrificial pattern region, and a thickness of the first sacrificial pattern region is greater than a thickness of the second sacrificial pattern region, wherein the patterned sacrificial layer is formed by a single-tone photomask or a half-tone photomask;

forming a pixel layer on the patterned sacrificial layer, the pixel layer comprising a plurality of pixels, wherein a pixel boundary is defined between each two of the pixels adjacent to each other, and the pixel boundary is disposed on the first sacrificial pattern region;

forming a transparent conductive layer on the pixel layer; and forming a patterned black photosensitive spacing material layer on the transparent conductive layer, wherein the patterned black photosensitive spacing material layer is formed by the single-tone photomask or the half-tone photomask.

18. The method of fabricating the color filter according to claim 17, wherein a thickness difference between the first sacrificial pattern region and the second sacrificial pattern region is between 0.8 and 1.5 micrometers, and a width of the first sacrificial pattern region is between 10 and 25 micrometers.

19. The method of fabricating the color filter according to claim 17, wherein each of the plurality of pixels comprises a plurality of sub-pixels, wherein a sub-pixel boundary is defined between each two of the sub-pixels adjacent to each other.

20. The method of fabricating the color filter according to claim 19, wherein a portion of each of the sub-pixels adjacent to the sub-pixel boundary has a protrusion.

* * * * *